US008111106B2

(12) United States Patent
Montreuil et al.

(10) Patent No.: US 8,111,106 B2
(45) Date of Patent: Feb. 7, 2012

(54) SWITCHED PHASE AND FREQUENCY DETECTOR BASED DPLL CIRCUIT WITH EXCELLENT WANDER AND JITTER PERFORMANCE AND FAST FREQUENCY ACQUISITION

(75) Inventors: Leo Montreuil, Atlanta, GA (US); Larry Stephen McKinney, Hoschton, GA (US); Jiening Ao, Suwanee, GA (US); Joel Paul Jenkins, Lawrenceville, GA (US)

(73) Assignee: Cisco Technology, Inc., San Jose, CA (US)

( * ) Notice: Subject to any disclaimer, the term of this patent is extended or adjusted under 35 U.S.C. 154(b) by 35 days.

(21) Appl. No.: 12/715,749

(22) Filed: Mar. 2, 2010

(65) Prior Publication Data

US 2011/0215873 A1 Sep. 8, 2011

(51) Int. Cl.
*H03L 7/087* (2006.01)
*H03D 13/00* (2006.01)

(52) U.S. Cl. ............... 331/11; 324/76.42; 324/76.47; 324/76.52; 324/76.58; 331/1 A; 331/25; 331/DIG. 2; 327/5; 327/9; 327/40; 375/375

(58) Field of Classification Search ............ 331/11, 331/16, 25, 1 A, DIG. 2; 324/76.41, 76.42, 324/76.47, 76.52, 76.55, 76.58, 76.77, 76.82; 327/2, 3, 5, 7, 8–10, 12, 40; 375/375
See application file for complete search history.

(56) References Cited

U.S. PATENT DOCUMENTS

| 4,943,788 | A | * | 7/1990 | Laws et al. ............... 331/11 |
| 5,512,860 | A | * | 4/1996 | Huscroft et al. ............ 331/1 A |
| 5,526,527 | A | * | 6/1996 | Lipowski et al. .......... 455/183.1 |
| 7,053,719 | B2 | * | 5/2006 | Steinbach et al. ............. 331/16 |
| 2008/0315959 | A1 | * | 12/2008 | Zhuang et al. ................. 331/17 |

* cited by examiner

*Primary Examiner* — Levi Gannon
(74) *Attorney, Agent, or Firm* — Merchant & Gould (57) ABSTRACT

Some embodiments of the present invention may include a DPLL circuit comprising a firmware. The firmware may comprise a re-sampled NCO phase detector capable of receiving a reference clock timing signal and a VCXO clock timing signal. The re-sampled NCO phase detector may comprise a resampler capable of receiving phase output and the VCXO clock timing signal and resampling the phase output; and a subtractor capable of receiving the resampled phase output and subtracting the resampled phase output from a calculated mean value of the phase output. The firmware may further comprise a frequency detector capable of receiving the reference clock timing signal and the VCXO clock timing signal; and a multiplexer capable of switching between the re-sampled NCO phase detector and the frequency detector dependent upon a frequency lock status.

19 Claims, 9 Drawing Sheets

SWITCHED PHASE AND FREQUENCY DETECTOR BASED DPLL CIRCUIT WITH EXCELLENT WANDER AND JITTER PERFORMANCE AND FAST FREQUENCY ACQUISITION

FIELD OF THE DISCLOSURE

The present disclosure relates to a switched phase and frequency detector based DPLL circuit with improved wander and jitter performance and improved frequency acquisition speed.

BACKGROUND

There is a need for a DPLL circuit with programmable loop parameters and with support for an arbitrary frequency ratio between the reference clock and the VCXO clock that has superior clock timing jitter and wander performance.

BRIEF DESCRIPTION OF THE DRAWINGS

The accompanying drawings, which are incorporated herein constitute a part of this disclosure, illustrate various embodiments of the present invention. In the drawings.

Both the foregoing general description and the following detailed description provide examples and are explanatory only. Accordingly, the foregoing general description and the followed detailed description should not be considered to be restrictive. Further, features or variations may be provided in addition to those set forth herein. For example, embodiments may be directed to various feature combinations and sub-combinations described in the detailed description.

DETAILED DESCRIPTION

The following detailed description refers to the accompanying drawings. Wherever possible, the same reference numbers are used in the drawings and the following description to refer to the same or similar elements. While embodiments may be described, modifications, adaptations, and other implementations are possible. For example, substitutions, additions, or modifications may be made to the elements illustrated in the drawings, and the methods described herein may be modified by substituting, reordering, or adding stages to the disclosed methods. Accordingly, the following detailed description does not limit the invention. Instead, the proper scope of the invention is defined by the appended claims.

In a modular Cable Modem Termination System ("CMTS") architecture, the downstream QAM symbol clock generated either in the CMTS QAM card or in the Edge QAM modulator is required to be locked to the 10.24 MHz DOCSIS master clock, which may be provided by the DOCSIS Timing Interface module. An extremely stable symbol clock with very low timing wander and jitter is essential to support Synchronous Code Division Multiple Access (S-CDMA) operation as well as T1 or T3 voice/data transport for DOCSIS. The DOCSIS Downstream RF interface standard states that the standard deviation of the timing error of the RF symbol clock as referenced to the DOCSIS master clock must be less than 1.5 ns per 100 seconds. This is known as the DOCSIS clock timing wander spec.

In a typical CMTS QAM card or edge QAM modulator, there may be multiple data processing clocks generated in a clock distribution tree. Each of these clocks may be locked to the 10.24 MHz DOCSIS master clock. To meet the phase noise performance levels defined in the DOCSIS Downstream RF interface standard for the RF output, a Voltage Controlled Crystal Oscillator (VCXO) is typically chosen to serve as the base frequency to the other data processing clocks responsible for generating the RF carrier frequency and symbol rate.

The nominal frequency of the VCXO may be somewhat arbitrary, but is generally related to the 10.24 MHz DOCSIS clock. The relation may be expressed as $f\_VCXO/f\_ref=M/N$ where M and N are integer numbers and $f\_ref=P*10.24$ MHz. P is also an integer number. $f\_ref$ is the frequency of the reference clock that is locked to the master clock.

The phase of the VCXO clock may be required to be locked to the phase of the reference clock in a ratio of M/N. This means that for every one out of M rising edges of the VCXO is required to be locked to every one out of N rising edges of the reference clock. This locking may be achieved by using Phase Lock Loop ("PLL") technology.

In modern implementations of PLL circuits, it may be advantageous to employ Digital PLL technology. Furthermore, it may be advantageous to employ a M/N frequency ratio and have loop dynamic parameters which may be fully programmable by software. This may allow for field upgrade capabilities. Also, it may be advantageous to integrate the entire DPLL circuit into a single device such as an FPGA or ASIC to reduce the component count, save PCB space, and reduce the product cost.

To meet the DOCSIS timing wander spec, the phase detector of the DPLL loop must have no dead zone or nearly zero dead zone. In other words, a non-zero detection voltage must always be produced whenever the phase of the VCXO clock is different from the phase of the reference clock. Many times, the acquisition range required for the DPLL may be much greater than the natural frequency of the loop due to a variety of reasons. As such, an aided acquisition mechanism may be required to achieve fast and reliable frequency acquisition at start up or upon the switching of the reference clock mode during operation.

Some embodiments of the present invention may include a DPLL circuit comprising a firmware. The firmware may comprise a re-sampled NCO phase detector capable of receiving a reference clock timing signal and a VCXO clock timing signal. The re-sampled NCO phase detector may comprise a resampler capable of receiving phase output and the VCXO clock timing signal and resampling the phase output; and a subtractor capable of receiving the resampled phase output and subtracting the resampled phase output from a calculated mean value of the phase output. The firmware may further comprise a frequency detector capable of receiving the reference clock timing signal and the VCXO clock timing signal; and a multiplexer capable of switching between the re-sampled NCO phase detector and the frequency detector dependent upon a frequency lock status.

Some embodiments of the present invention may include a method including the steps of receiving a reference clock timing signal and a VCXO clock timing signal at a re-sampled NCO phase detector; determining a phase output; receiving the phase output and the VCXO clock timing signal at a resampler; resampling the phase output; receiving the resampled phase output at a subtractor; subtracting the resampled phase output from a calculated mean value of the phase output; receiving the reference clock timing signal and the VCXO clock timing signal at a frequency detector; and switching between the re-sampled NCO phase detector and the frequency detector as the active detector dependent upon a frequency lock status.

Figure 1:
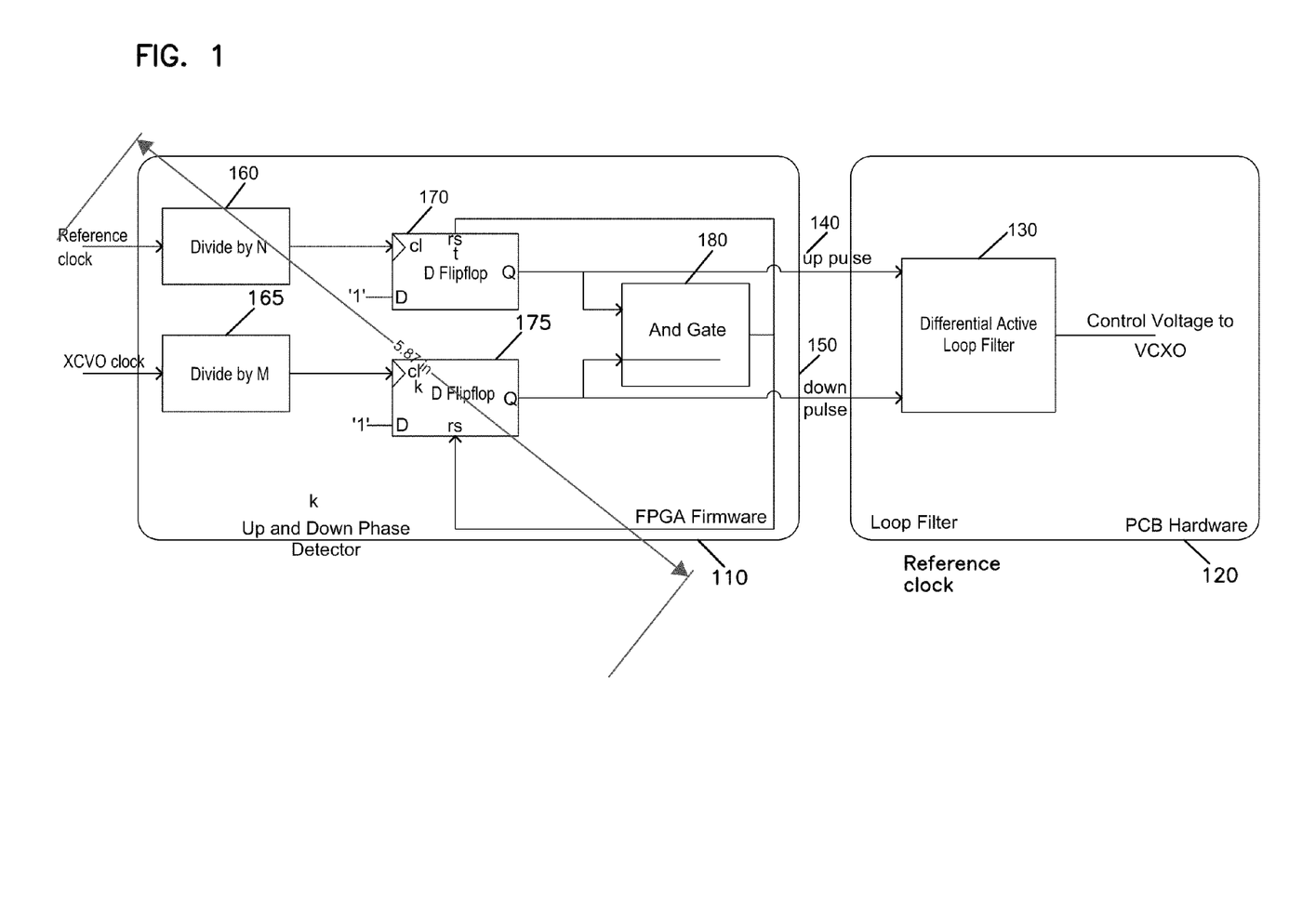
FIG. 1 illustrates embodiments of a DPLL circuit with a phase detector in firmware and a loop filter in hardware.

FIG. 1 illustrates embodiments of a DPLL circuit with a phase detector in firmware and a loop filter in hardware. The DPLL circuit may contain firmware 110 and hardware 120. Firmware 110 may be FPGA firmware. Hardware 120 may be PCB hardware. DPLL circuit 100 may operate as a clock distribution circuit. Notably, in this DPLL circuit, no specific clock timing wander performance is required.

Firmware 110 may comprise a digital phase detector, while hardware 120 may comprise an analog loop filter. Firmware 110 may have two output terminals. These output terminals may comprise an up pulse output 140 and a down phase output 150. The difference of the duty ratio of the up pulse and down pulse may be determined by an operational amplifier. Embodiments of firmware 110 may additionally contain divider 160, divider 165, flipflop 170, flipflop 175, and gate 180.

This operational amplifier is located external to firmware 110. For example, the operational amplifier may serve as the differential active loop filter 130 stored on hardware 120. In some embodiments, hardware 120 may include several resistors and capacitors to determine the loop dynamic parameters. Such parameters may include the natural frequency and the damping factor. Due to the location of the components stored on hardware 120, the loop parameters are not generally available to be programmed on DPLL circuit 100.

Figure 2:
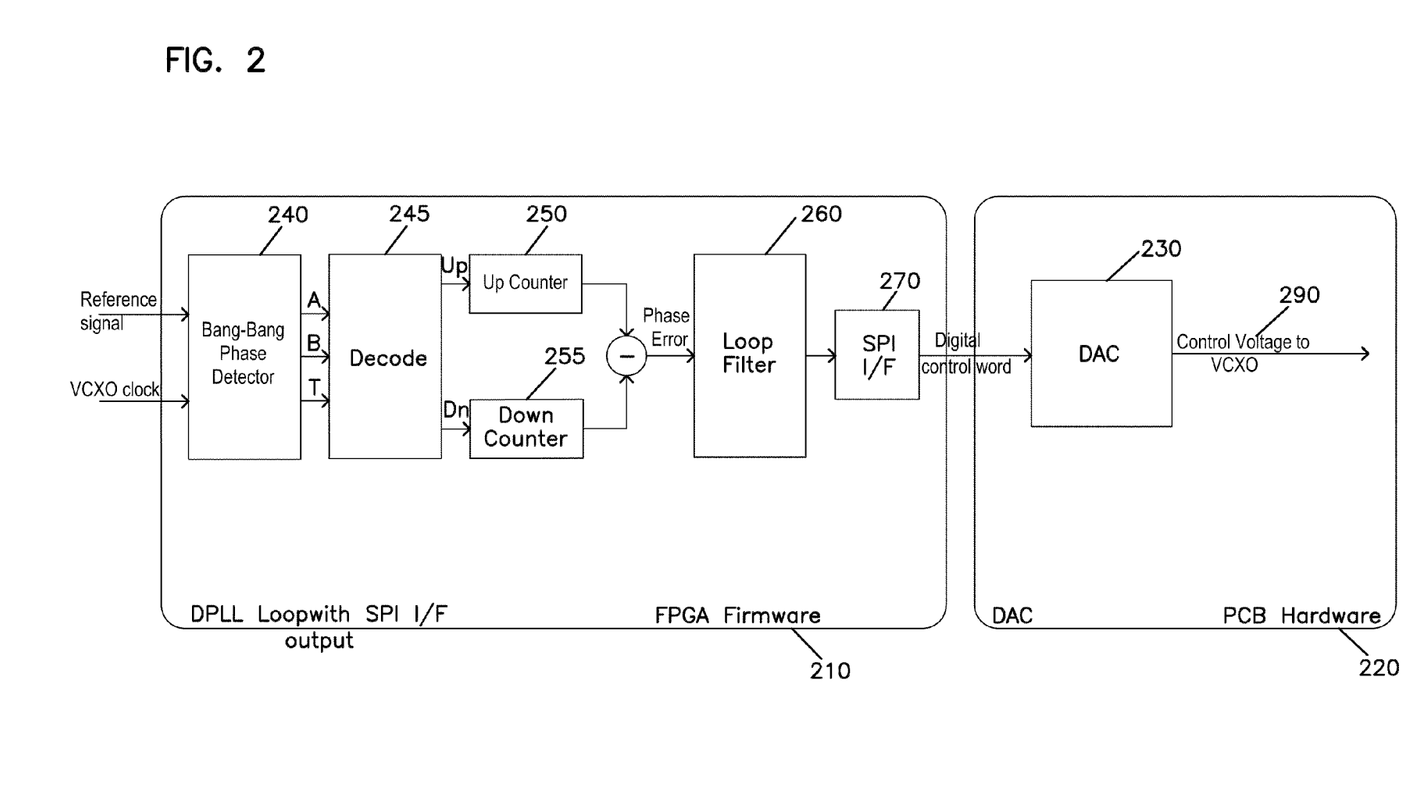
FIG. 2 illustrates embodiments of a DPLL circuit with a phase detector and a loop filter in firmware and a digital to analog converter in hardware.

FIG. 2 illustrates embodiments of a DPLL circuit with a phase detector and a loop filter in firmware and a digital to analog converter in hardware. The DPLL circuit may contain firmware 210 and hardware 220. Firmware 210 may be FPGA firmware. Hardware 220 may be PCB hardware. The phase detector located on firmware 210 may be a bang-bang phase detector 240. A digital to analog converter 230 may be located on hardware 220 and may operate to drive a VCXO clock with control voltage 290. Embodiments of firmware 210 may additionally contain elements such as a decoder 245, up counter 250, down counter 255, loop filter 260, and SPI 270.

Bang-bang phase detector 240 may work well for a clock recovery application, but it may require that the VCXO clock is at the same or a multiple frequency of the reference clock. Such an application may not work where the VCXO clock is related to the reference clock in an arbitrary ratio. Bang-bang phase detector 240 may also suffer from a small dead zone near the vicinity of the loop equilibrium. Such a small dead zone may result in undesirable levels of timing wander and jitter.

Figure 3:
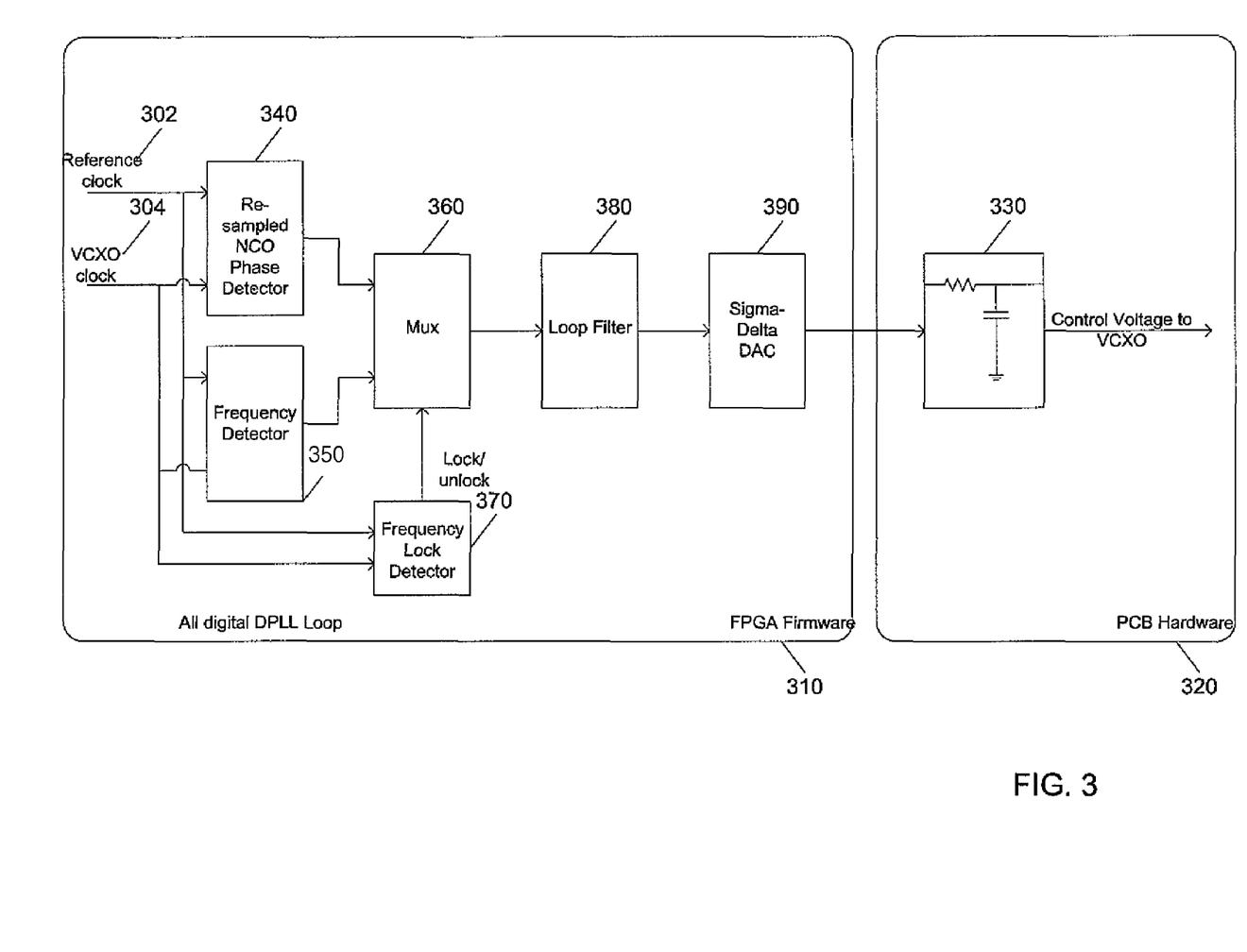
FIG. 3 illustrates a DPLL circuit according to embodiments of the present invention.

FIG. 3 illustrates a DPLL circuit according to embodiments of the present invention. As illustrated, the entire DPLL circuit may be contained within digital firmware 310. Firmware 310 may be an FPGA or ASIC firmware. The only component which may not be directly located on firmware 310 is a simple RC filter 330. RC filter 330 may operate to filter out the clock frequency and the related harmonics present in the Pulse Width Modulation (PWM) output. These embodiments allow for the frequency ratio (M/N) and loop dynamic parameters to be fully programmable via software. Programmable loop parameters may include at least natural bandwidth and damping factor.

Figure 4:
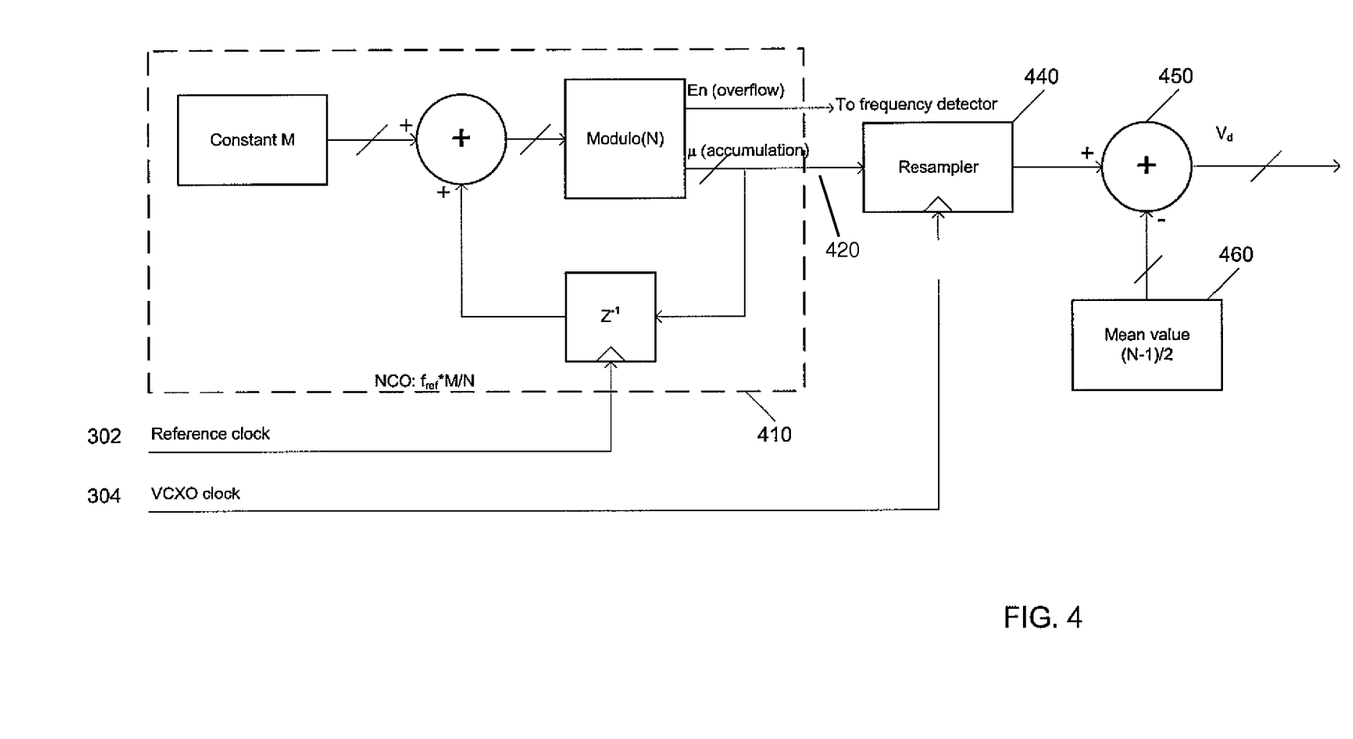
FIG. 4 illustrates embodiments of an NCO phase detector.

Firmware 310 may contain a re-sampled Numerically-Controlled Oscillator (NCO) phase detector 340. NCO phase detector 340 may have a sawtooth shaped phase detection characteristic which has no dead zone. FIG. 4 illustrates embodiments of NCO phase detector 340. In illustrated block 410, an NCO may be generated in accordance with the rising edge of reference clock 302. For example, the NCO may be generated with frequency f_ref*(M/N).

The phase output 420 may be transmitted to resampler 440. Resampler 440 also may receive input from VCXO clock 304. Resampler 440 may resample phase output 420 by VCXO clock 304. The resampled phase value may then be provided to a subtractor 450. Subtractor 450 may then subtract the resampled phase value from the mean value of the NCO phase output. The mean NCO phase output may be calculated as (N−1)/2. This mean NCO phase output value may represent the loop equilibrium point of the DPLL at which the clock edge of VCXO clock 304 may be phase locked to the clock edge of reference clock 302. The output of subtractor 450 may be the phase detection voltage which may be a sawtooth function of the phase error.

For example, the M and N values for a DPLL may be 3 and 8 respectively. At N=8, the mean NCO phase output is (N−1)/2 or 3.5. The phase detector output may have a period of N*T_ref=8*T_ref, or M*T_VCXO=3*T_VCXO, where T_ref and T_VCXO are the period of reference clock 302 and VCXO clock 304 respectively.

Figure 5:
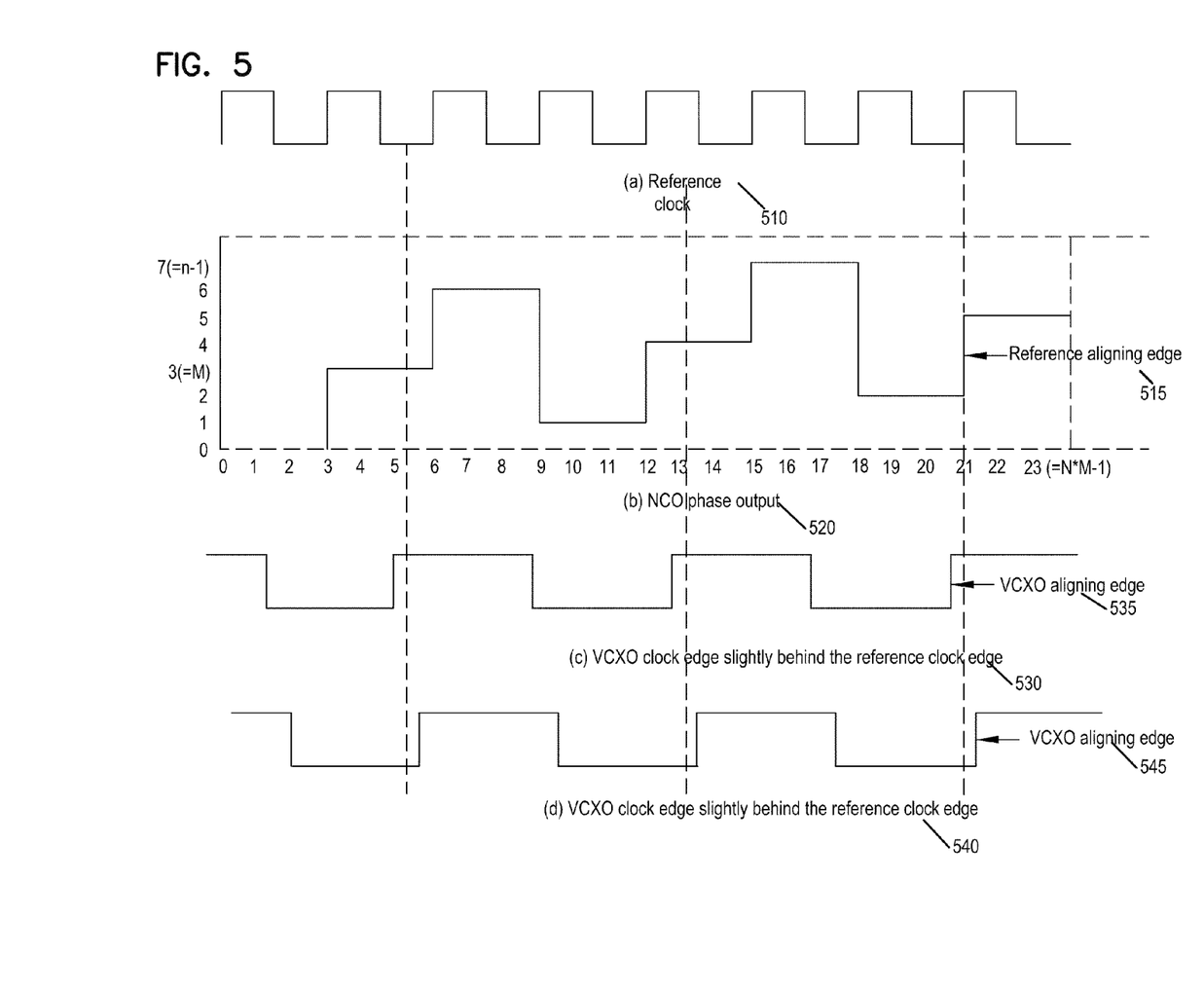
FIG. 5 illustrates embodiments of the present invention.

FIG. 5 illustrates embodiments of the above-referenced example where M=3 and N=8. Notably, in any given phase detection period, one and only one rising edge of the VCXO clock (designated as the VCXO aligning edge) is phase aligned to one and only one rising edge of the reference clock (designated as the reference aligning edge) when the DPLL reference clock path 510 may represent the path of a reference clock, such as reference clock 302. Similarly, NCO phase output path 520 may represent the output of an NCO phase detector, such as NCO phase detector 340. VCXO clock output path 530 may represent the path of a VCXO clock in the instance that the VCXO clock aligning edge 535 is slightly ahead of the reference clock 302 aligning edge 515. The VCXO clock represented in path 530 may be VCXO clock 304.

In embodiments where the VCXO clock aligning edge 535 is slightly ahead of the reference clock 302 aligning edge 515, the three resampled NCO phase values in a given detection period may be 3, 4, and 2, resulting in an average phase value of 3 and a detection voltage of −0.5.

Embodiments where the VCXO aligning edge 545 is slightly behind the reference clock 302 aligning edge 515 are illustrated in path 540. In these embodiments the three resampled NCO phase values in a given detection period may be 3, 4, and 5, resulting in an average phase value of 4 and a detection voltage of +0.5. As such, only when the aligning edge of the VCXO clock is directly on the aligning edge of the reference clock in every detection period will the output voltage of the phase detector be 0. As a result, there is no dead zone near the loop equilibrium for this phase detector.

Figure 6:
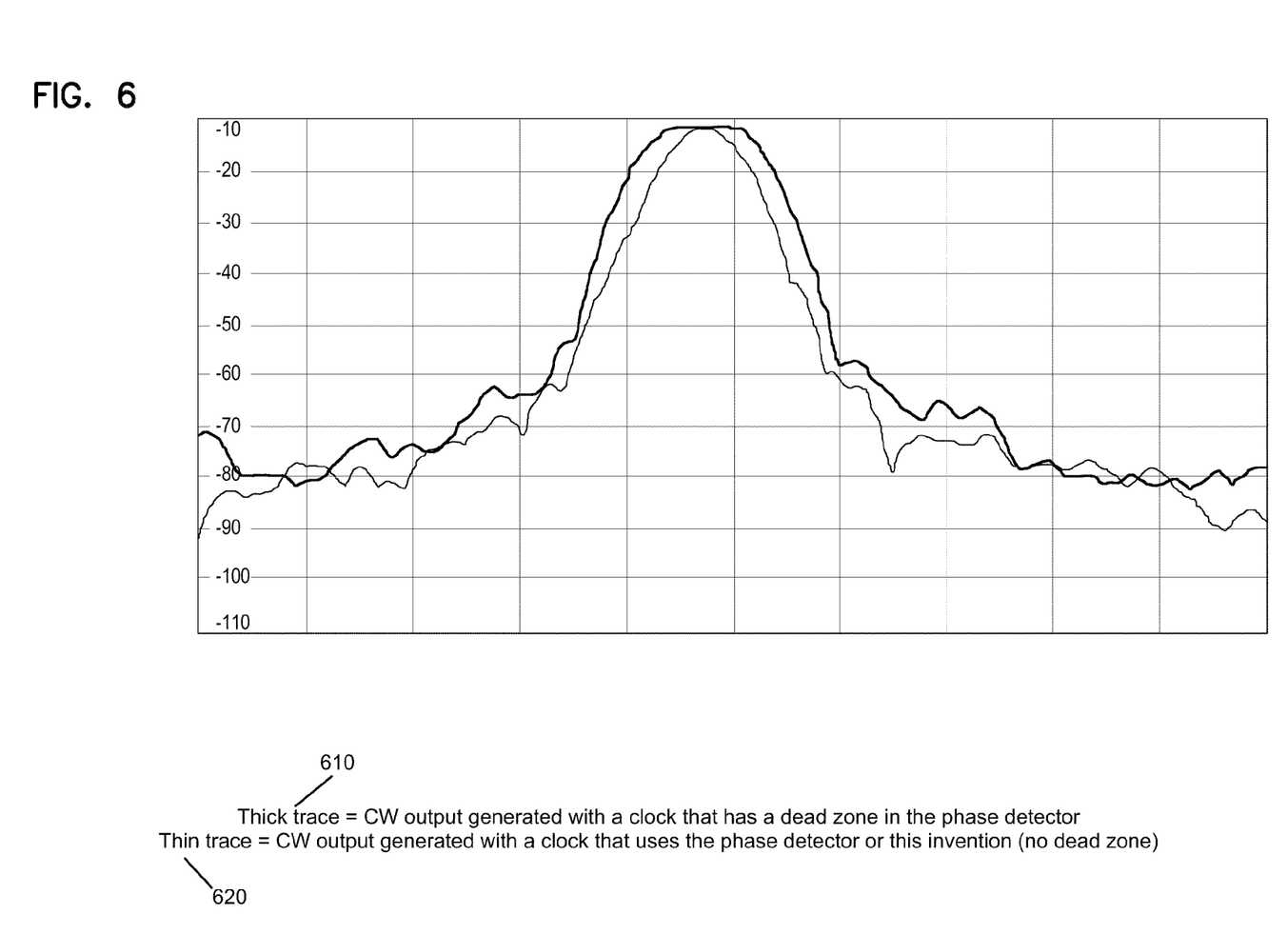
FIG. 6 illustrates measurements demonstrating symbol clock timing wander when employing embodiments of the present invention.

FIG. 6 illustrates measurements demonstrating symbol clock timing wander when employing embodiments of the present invention. The signal clock timing wander may be measured by measuring the RF output in a Continuous Wave (CW) mode using an RF spectrum analyzer in a maximum hold format. The RF output of a RFGW-1 EQAM modulator containing a generic phase detector is illustrated by trace 610. The actual RF frequency fluctuates back and forth with a peak to peak variation of about 20 Hz. The same RF output employing embodiments of the present invention is plotted by trace 620. The RF frequency in this instance is locked at a fixed frequency without visible fluctuation.

Figure 7:
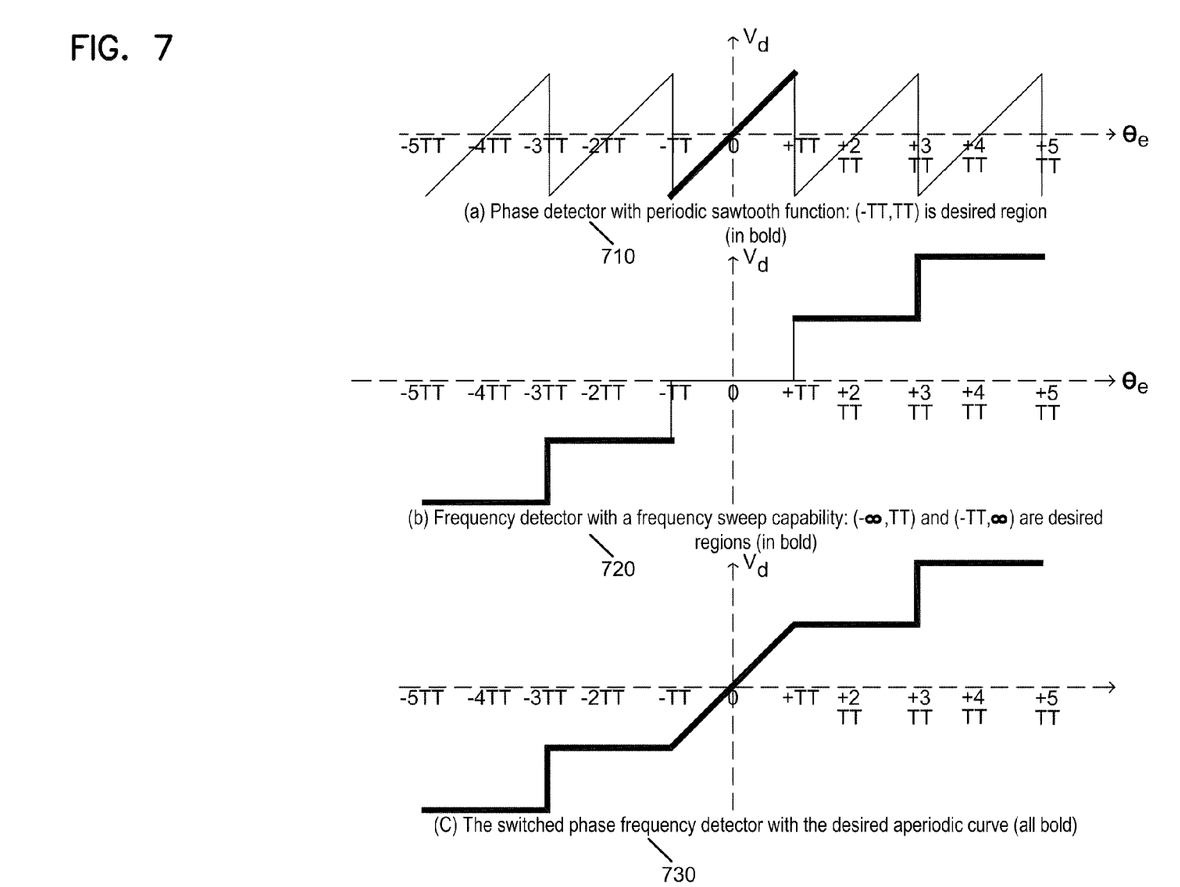
FIG. 7 illustrates the detection voltage of embodiments of the phase detector.

FIG. 7 illustrates the detection voltage of embodiments of the phase detector of the present invention. Path 710 illustrates that the detection voltage of the phase detector may be a periodic sawtooth function of the phase error. In general, any phase detector that has similar periodic characteristics would experience slow frequency acquisition due to the roll over of detection voltage. This slow frequency acquisition may become a serious issue when the initial frequency error is larger, corresponding to a phase error well beyond the region (−pi, +pi).

Embodiments of the frequency detector with automatic sweeping capabilities are illustrated on path 720. Path 720 shows the phase detection characteristic of a frequency detector with automatic sweeping capability. This frequency detector may have an undesirable characteristic in the region (−pi, +pi) as it provides no detection voltage in that region. Accordingly, it may cause significant timing wander if it is used in the lock state.

However, by combining the characteristic of region (−pi, +pi) on path 710 with the characteristic of the area outside of region (−pi, +pi) on path 720, an optimum phase detection characteristic may be created as illustrated in path 730. Path 730 shows embodiments of a combined phase detector which has a desired aperiodic characteristic that avoids the periodic detection voltage roll over. As such, the combined phase detector may greatly speed up the frequency acquisition while maintaining the excellent wander and jitter performance provided in the lock state. This may be achieved by use of a switching mechanism based on the frequency lock detection.

Figure 8:
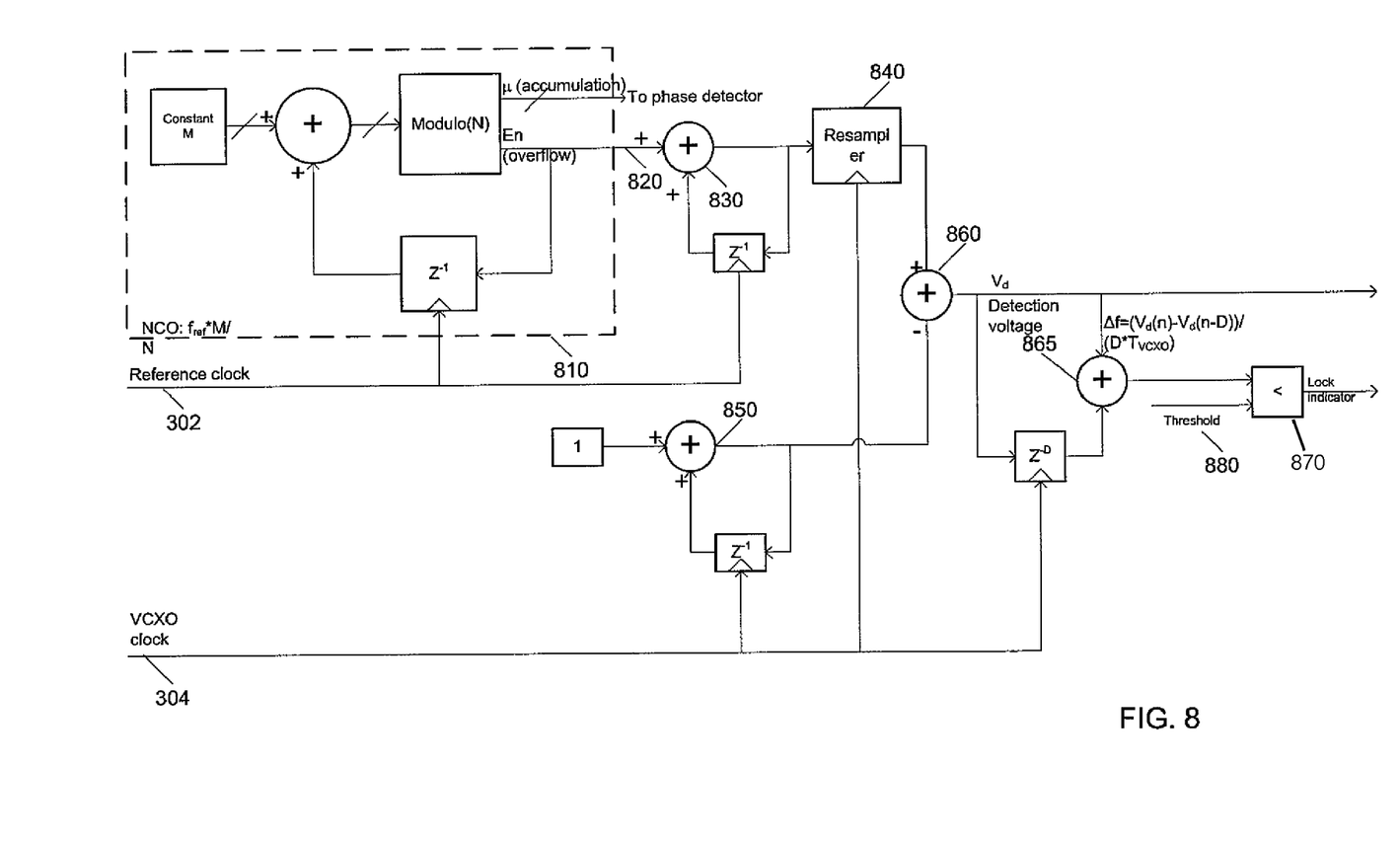
FIG. 8 illustrates embodiments of the frequency detector and lock detector of the present invention.

FIG. 8 illustrates embodiments of the frequency detector and lock detector of the present invention. NCO 810 may provide enable (overflow) output to drive an accumulator 830 in accordance with reference clock 302. Accumulator 830 output may then be resampled by the VCXO clock 304 at resampler 840. The resampler 840 output may then be subtracted by accumulator 850 output driven by VCXO clock 304. This step may be performed by subtractor 860.

The output of subtractor 860 may be the detection voltage of the frequency detector designated as V_d. To derive the frequency error, the current detection voltage sample V_d(n) may be subtracted by the D cycle delayed sample V_d(n−D) at subtractor 865. The frequency error may then be calculated using (V_d(n)−V_d(n−D))/(D*T_VCXO), where T_VCXO is the period of the VCXO clock 304 and the delay cycle D may determine the resolution of the measured frequency error. A comparator 870 may be used in some embodiments to determine the frequency lock using a lock threshold 880.

Referring back to FIG. 3, when the frequency is not locked, the frequency detector 350 may be selected by multiplexer 360 and DPLL loop 310 may operate in a frequency sweep mode as discussed above. As the VCXO clock 304 frequency gets closer to the reference clock 302 frequency and the phase error approaches the region (−pi, +pi), the frequency lock detector 370 will declare lock, and the phase detector 340 will then be selected by multiplexer 360. During normal operation, the phase detector 340 may serve as the active detector as long as frequency lock is maintained. When frequency lock is lost, DPLL loop 310 will switch to the frequency detector 350 and begin a new frequency acquisition process automatically. Some embodiments of DPLL loop 310 may also comprise a loop filter 380 and sigma-delta digital to analog converter 390.

Figure 9:
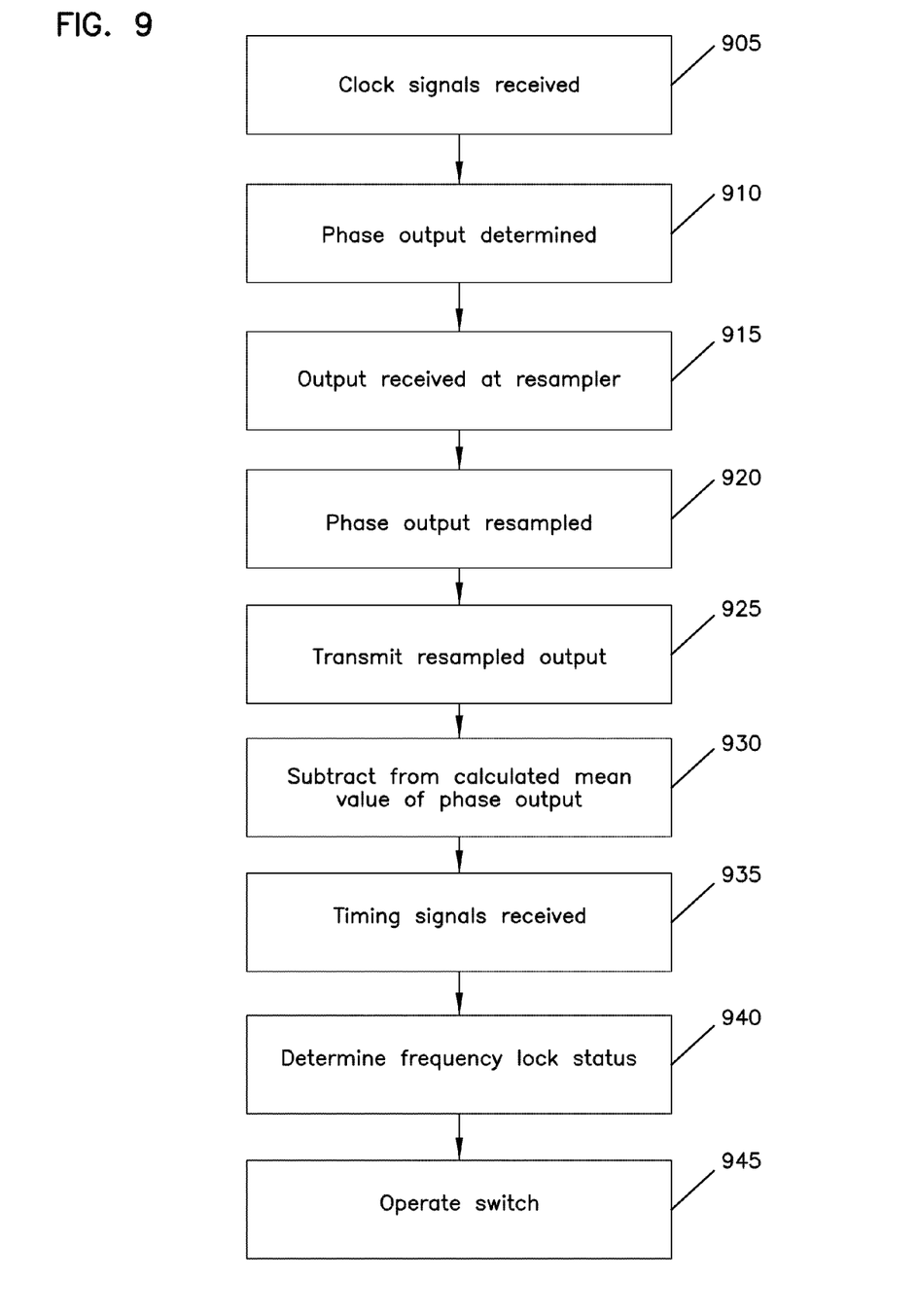
FIG. 9 illustrates a flow chart of embodiments of the present invention.

FIG. 9 illustrates a flow chart of embodiments of the present invention. The method may start at step 905 where a reference clock timing signal and a VCXO clock timing signal may be received at a re-sampled NCO phase detector. The method may then proceed to step 910 where a phase output may be determined.

Upon completion of step 910, the method may then proceed to step 915 where the phase output and the VCXO clock timing signal may be received at a resampler. The resampler may then resample the phase output at step 920. Next, at step 925, the resampled phase output may be transmitted to a subtractor.

The subtractor may then subtract the resampled phase output from a calculated mean value of the phase output at step 930. Next at step 935, the reference clock timing signal and the VCXO clock timing signal may be received at a frequency detector.

At step 940 a frequency lock status is determined by a frequency lock indicator. The method may then move to step 945 where a switch may be employed to switch between the re-sampled NCO phase detector and the frequency detector as the active detector dependent upon the determined frequency lock status. For example, the switch may select the re-sampled NCO phase detector when a frequency lock is determined. Similarly, the switch may select the frequency detector when a loss of frequency lock is determined.

Embodiments of the present invention may be embodied in any computer-readable medium for use by or in connection with an instruction execution system, apparatus, or device. Such instruction execution systems may include any computer-based system, processor-containing system, or other system that can fetch and execute the instructions from the instruction execution system. In the context of this disclosure, a "computer-readable medium" can be any means that can contain, store, communicate, propagate, or transport the program for use by, or in connection with, the instruction execution system. The computer readable medium can be, for example but not limited to, a system or that is based on electronic, magnetic, optical, electromagnetic, infrared, or semiconductor technology.

Specific examples of a computer-readable medium using electronic technology would include (but are not limited to) the following: random access memory (RAM); read-only memory (ROM); and erasable programmable read-only memory (EPROM or Flash memory). A specific example using magnetic technology includes (but is not limited to) a portable computer diskette. Specific examples using optical technology include (but are not limited to) compact disk (CD) and digital video disk (DVD).

Any software components illustrated herein are abstractions chosen to illustrate how functionality may be partitioned among components in some embodiments of the present invention disclosed herein. Other divisions of functionality may also be possible, and these other possibilities may be intended to be within the scope of this disclosure. Furthermore, to the extent that software components may be described in terms of specific data structures (e.g., arrays, lists, flags, pointers, collections, etc.), other data structures providing similar functionality can be used instead.

Any software components included herein are described in terms of code and data, rather than with reference to a particular hardware device executing that code. Furthermore, to the extent that system and methods are described in object-oriented terms, there is no requirement that the systems and methods be implemented in an object-oriented language. Rather, the systems and methods can be implemented in any programming language, and executed on any hardware platform.

Any software components referred to herein include executable code that is packaged, for example, as a standalone executable file, a library, a shared library, a loadable module, a driver, or an assembly, as well as interpreted code that is packaged, for example, as a class. In general, the components used by the systems and methods of reducing media stream delay are described herein in terms of code and data, rather than with reference to a particular hardware device executing that code. Furthermore, the systems and methods can be implemented in any programming language, and executed on any hardware platform.

The flow charts, messaging diagrams, state diagrams, and/or data flow diagrams herein provide examples of the operation of systems and methods of reducing media stream delay through independent decoder clocks, according to embodiments disclosed herein. Alternatively, these diagrams may be viewed as depicting actions of an example of a method. Blocks in these diagrams represent procedures, functions, modules, or portions of code which include one or more executable instructions for implementing logical functions or steps in the process.

Alternate implementations may also be included within the scope of the disclosure. In these alternate implementations, functions may be executed out of order from that shown or discussed, including substantially concurrently or in reverse order, depending on the functionality involved. The foregoing description has been presented for purposes of illustration and description. It is not intended to be exhaustive or to limit the disclosure to the precise forms disclosed. Obvious modifications or variations are possible in light of the above teachings. The implementations discussed, however, were chosen and described to illustrate the principles of the disclosure and its practical application to thereby enable one of ordinary skill in the art to utilize the disclosure in various implementations and with various modifications as are suited to the particular use contemplated. All such modifications and variation are within the scope of the disclosure as determined by the appended claims when interpreted in accordance with the breadth to which they are fairly and legally entitled.

What is claimed is:

1. A DPLL circuit comprising:
   a firmware comprising:
   a re-sampled NCO phase detector capable of receiving a reference clock timing signal and a VCXO clock timing signal wherein the re-sampled NCO phase detector comprises:
   a resampler capable of receiving phase output and the VCXO clock timing signal and resampling the phase output; and
   a subtractor capable of receiving the resampled phase output and subtracting the resampled phase output from a calculated mean value of the phase output;
   a frequency detector capable of receiving the reference clock timing signal and the VCXO clock timing signal; and
   a multiplexer capable of switching between the re-sampled NCO phase detector and the frequency detector dependent upon a frequency lock status.

2. The DPLL circuit of claim 1, wherein the firmware is FPGA firmware or ASIC firmware.

3. The DPLL circuit of claim 1, wherein the NCO phase detector has a sawtooth shaped phase detection characteristic with no dead zone.

4. The DPLL circuit of claim 3, wherein the output of the subtractor is a phase detection voltage.

5. The DPLL circuit of claim 1, further comprising:
   a frequency lock detector in communication with the reference clock timing signal, the VCXO clock timing signal, and the multiplexer.

6. The DPLL circuit of claim 5, further comprising:
   the frequency lock detector programmed to operate the multiplexer to select the NCO phase detector when a frequency lock is declared.

7. The DPLL circuit of claim 5, further comprising:
   the frequency lock detector programmed to operate the multiplexer to select the frequency detector when a frequency lock is lost.

8. The DPLL circuit of claim 5, wherein the frequency lock detector further comprises:
   a comparator capable of comparing the measured frequency error with a frequency lock threshold.

9. A method comprising:
   receiving a reference clock timing signal and a VCXO clock timing signal at a re-sampled NCO phase detector;
   determining a phase output;
   receiving the phase output and the VCXO clock timing signal at a resampler;
   resampling the phase output;
   receiving the resampled phase output at a subtractor;
   subtracting the resampled phase output from a calculated mean value of the phase output;
   receiving the reference clock timing signal and the VCXO clock timing signal at a frequency detector; and
   switching between the re-sampled NCO phase detector and the frequency detector as the active detector dependent upon a frequency lock status.

10. The method of claim 9, wherein the frequency lock status is determined by a frequency lock indicator.

11. The method of claim 10, further comprising:
    switching to the re-sampled NCO phase detector when a frequency lock is determined.

12. The method of claim 10, further comprising:
    switching to the frequency detector when a loss of frequency lock is determined.

13. The method of claim 9, further comprising:
    programming the frequency ratio between the reference clock timing signal and a VCXO clock timing signal.

14. The method of claim 13, further comprising:
    programming the frequency ratio to be arbitrary.

15. A system comprising:
    a frequency detector providing enable output;
    an accumulator in communication with a reference clock driven by the enable output;
    a resampler for resampling an accumulator output by a VCXO clock; a calculator for calculating a detection voltage and a frequency error from a resampler output wherein the calculator comprises:
    a second accumulator driven by the VCXO clock;
    a first subtractor using the output of the second accumulator to determine the detection voltage; and
    a second subtractor using the output of the first subtractor to determine the frequency error; and
    a lock indicator wherein the lock indicator setting is determined by the detection voltage.

16. The system of claim 15, further comprising:
    a comparator to compare the detection voltage with a predetermined threshold.

17. The system of claim 16, wherein the lock indicator setting is based upon the output of the comparator.

18. The system of claim 15, wherein the frequency detector is selected when the frequency is not locked.

19. The system of claim 18, wherein a phase detector is selected when the frequency is locked.

* * * * *